US010782338B2

(12) United States Patent
Degrenne et al.

(10) Patent No.: US 10,782,338 B2
(45) Date of Patent: Sep. 22, 2020

(54) METHOD AND DEVICE FOR ESTIMATING LEVEL OF DAMAGE OR LIFETIME EXPECTATION OF POWER SEMICONDUCTOR MODULE

(71) Applicant: MITSUBISHI ELECTRIC CORPORATION, Tokyo (JP)

(72) Inventors: Nicolas Degrenne, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 178 days.

(21) Appl. No.: 16/067,860

(22) PCT Filed: Feb. 15, 2017

(86) PCT No.: PCT/JP2017/006446
§ 371 (c)(1),
(2) Date: Jul. 3, 2018

(87) PCT Pub. No.: WO2017/169313
PCT Pub. Date: Oct. 5, 2017

(65) Prior Publication Data
US 2019/0331729 A1    Oct. 31, 2019

(30) Foreign Application Priority Data

Mar. 30, 2016    (EP) .................................... 16162868

(51) Int. Cl.
*G01R 31/28*    (2006.01)
*G01B 11/16*    (2006.01)

(52) U.S. Cl.
CPC .......... *G01R 31/2817* (2013.01); *G01B 11/16* (2013.01); *G01R 31/2818* (2013.01)

(58) Field of Classification Search
CPC ....... H01L 2924/00; H01L 2224/45015; H01L 2224/45124; H01L 2924/13055;
(Continued)

(56) References Cited

U.S. PATENT DOCUMENTS 5,528,446 A * 6/1996 Sankaran ............. G01R 31/006
361/103
6,122,170 A * 9/2000 Hirose .................. C04B 37/026
174/16.3

(Continued)

FOREIGN PATENT DOCUMENTS

EP    0969511 A2    1/2000
EP    0969511 A3    10/2003

*Primary Examiner* — Vinh P Nguyen
(74) *Attorney, Agent, or Firm* — Birch, Stewart, Kolasch & Birch, LLP (57) ABSTRACT

A method estimates a level of damage or a lifetime expectation of a power semiconductor module having at least one die that is mechanically and electrically attached to a ceramic substrate. The ceramic substrate has piezoelectric properties and the method includes: controlling the at least one power die, the control of the at least one power die generating changes in the electrical potential across the ceramic substrate; obtaining information representative of a mechanical deformation of the ceramic substrate; determining if a notification indicating the level of damage or the lifetime expectation has to be performed according to the obtained information and reference information; and notifying the level of damage or the lifetime expectation if the determining step determines that the notification has to be performed.

13 Claims, 4 Drawing Sheets

(58) Field of Classification Search
CPC ... H01L 2924/15787; H01L 2224/4807; H01L 2224/48458; H01L 2224/78; H01L 2224/78301; H01L 2224/85; H01L 2224/85205; H01L 24/78; H01L 24/85; H01L 2924/01004; H01L 2924/01005; H01L 2924/01006; H01L 2924/01013; H01L 2924/01033; H01L 2924/01082; H01L 2924/014; G01R 31/2817; G01R 31/2818; G01R 29/22; G01R 31/281; G01B 11/16
See application file for complete search history.

(56) References Cited

U.S. PATENT DOCUMENTS

| | | | |
|---|---|---|---|
| 6,650,559 B1* | 11/2003 | Okamoto | H01L 23/3672 |
| | | | 257/E23.103 |
| 8,164,176 B2* | 4/2012 | Siepe | H01L 23/3735 |
| | | | 257/703 |
| 8,884,634 B2* | 11/2014 | Hirohata | H01L 23/64 |
| | | | 324/676 |
| 2012/0248440 A1 | 10/2012 | Hirohata et al. | |

* cited by examiner

METHOD AND DEVICE FOR ESTIMATING LEVEL OF DAMAGE OR LIFETIME EXPECTATION OF POWER SEMICONDUCTOR MODULE

TECHNICAL FIELD

The present invention relates generally to a method and device for estimating a level of damage or a lifetime expectation of a power semiconductor module comprising at least one die that is mechanically, thermally, and electrically attached to a ceramic substrate.

BACKGROUND ART

In the field of Power Electronics, some components are known as vulnerable, power semiconductor modules are one of them.

In power semiconductor modules, one or several power semiconductor dies are mechanically, thermally, and electrically attached to a substrate. Because of thermal expansion mismatch between the different materials in the structure, like for example silicon, silicon carbide, gallium nitride, solder, sintering paste, copper, ceramic, aluminium, mechanical stress is created. The mechanical stress may affect the structure of the power semiconductor modules like for example, cracks, voids, delaminations of materials and/or interfaces and may lead to the failure of the power semiconductor module.

For example, when the electric assembly is used in electrical cars, it is important to identify on which vehicles the electric assembly has reached a significant damage level. The constructor can warn the customer and propose a control/exchange of the near-to-be-damaged electric assembly. This service provides an increased quality control for the fleet of vehicles.

The same arises for a fleet of offshore windmills where the maintenance costs are prohibitive and access is limited.

SUMMARY OF INVENTION

The present invention aims at estimating the level of damage of an electric assembly that is an important feature for the constructor and/or customer.

To that end, the present invention concerns a method for estimating a level of damage or a lifetime expectation of a power semiconductor module comprising at least one die that is mechanically and electrically attached to a ceramic substrate, characterized in that the ceramic substrate has piezoelectric properties and the method comprises the steps of:
controlling the at least one power die, the control of the at least one power die generating changes in the electrical potential across the ceramic substrate,
obtaining information representative of a mechanical deformation of the ceramic substrate,
determining if a notification indicating the level of damage or the lifetime expectation has to be performed according to the obtained information and reference information,
notifying the level of damage or the lifetime expectation if the determining step determines that the notification has to be performed.

The present invention concerns also a device for estimating a level of damage or a lifetime expectation of a power semiconductor module comprising at least one die that is mechanically and electrically attached to a ceramic substrate, characterized in that the ceramic substrate has piezoelectric properties and the device comprises:
means for controlling the at least one power die, the control of the at least one power die generating changes in the electrical potential across the ceramic substrate,
means for obtaining information representative of a mechanical deformation of the ceramic substrate,
means for determining if a notification indicating the level of damage or the lifetime expectation has to be performed according to the obtained information and reference information,
means for notifying the level of damage or the lifetime expectation if the determining step determines that the notification has to be performed.

Thus, the mechanical deformation of the ceramic substrate is used to provide information on the level of degradation of the power semiconductor module. Thus the level of damage can be estimated.

According to a particular feature, information representative of the mechanical deformation of the ceramic substrate is a common mode current that flows across the ceramic substrate.

Thus, the common mode current can be measured outside of the power semiconductor module, for example between a heat-sink of the power semiconductor module and the ground. The power semiconductor module does not require additional sensor.

According to a particular feature, the common mode current is measured directly.

Thus, a simple current sensor can be used for example between the heat-sink and the ground potential.

According to a particular feature, the common mode current is measured indirectly.

Thus, a differential current sensor can be used for example between two conductors supplying the electric power to the power semiconductor module.

According to a particular feature, information representative of the mechanical deformation of the ceramic substrate is obtained using a copper pad attached on the top surface of the ceramic substrate.

Thus, a small area on the substrate is used as a low-cost electromechanical sensor.

According to a particular feature, information representative of the mechanical deformation of the ceramic substrate is a voltage between the copper pad and a copper layer at the bottom of the ceramic substrate.

Thus, a simple differential voltage sensor can be used.

According to a particular feature, a DC voltage is applied between the copper pad used as electrode and a copper layer at the bottom of the ceramic substrate and information representative of the mechanical deformation of the ceramic substrate is a current flowing through the copper pad.

According to a particular feature, information representative of the mechanical deformation of the ceramic substrate is obtained using an electromechanical receptor that is integrated in the power semiconductor module Thus, a more sensitive and/or selective measure can be performed.

According to a particular feature, information representative of the mechanical deformation of the ceramic substrate is obtained using an optical source that generates a beam that is reflected by the surface of the ceramic substrate and received by an optical sensor.

Thus, a smaller area is used on the surface of the substrate to generate a more sensitive and/or selective measure.

According to a particular feature, the determining if a notification indicating the level of damage or the lifetime expectation has to be performed is executed by transposing in the frequency domain the information representative of the mechanical deformation by a Fast Fourrier Transform.

Thus, a frequency modification and/or attenuation/amplification can be more easily detected.

According to a particular feature, the determining if a notification indicating the level of damage or the lifetime expectation has to be performed is executed by determining a distance between dominant frequencies and an initial set of dominant frequencies.

Thus, the evolution of a resonant frequency can be quantified.

According to a particular feature, the distance is based on an amplitude at a predetermined frequency and on an initial amplitude at the predetermined frequency.

Thus, the damping of a resonant frequency can be quantified. The characteristics of the invention will emerge more clearly from a reading of the following description of example embodiments, the said description being produced with reference to the accompanying drawings, among which:

DESCRIPTION OF EMBODIMENTS

Figure 1:
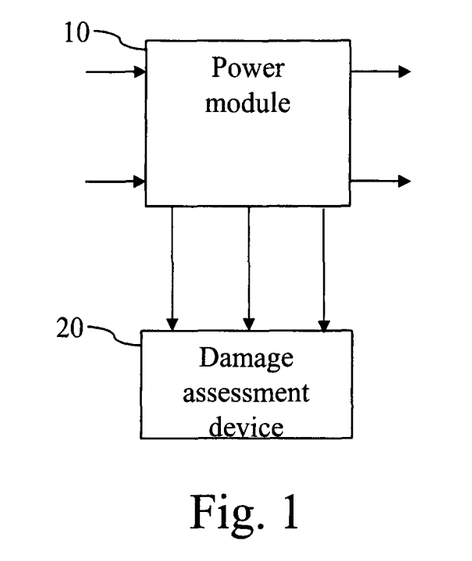
FIG. 1 represents an example of an architecture of a system for determining the damage assessment of a power semiconductor module according to the present invention.

FIG. 1 represents an example of an architecture of a system for determining the damage assessment of a power semiconductor module according to the present invention.

The system for determining the damage assessment of a power semiconductor module is for example implemented in an electric car or in a train or in an offshore windmill.

A damage assessment device 20 is used for determining the level of damage of at least one power semiconductor module.

In the example of FIG. 1, the damage assessment device 20 is used for determining the level of damage of a power semiconductor module 10.

The damage assessment device 20 evaluates the state of health of the power semiconductor module 10 containing one or more power semiconductor dies. The damage assessment device 20 performs on-line degradation localization based on ceramic substrate electromechanical response when power dies of the power module are electrically excited. In other terms, the ceramic substrate electromechanical response of a substrate of the power semiconductor module 10 is updated in real-time and the evolution of the ceramic substrate electromechanical response is used as an indicator of structural change within the power semiconductor module 10.

More precisely, a ceramic substrate, like for example a substrate in Aluminium Nitride or a substrate in alumina dopped with Zirconium dioxide, has piezoelectrical properties. Due to high switching transients of the power that are attached to the ceramic substrate, mechanical impulsions are created within the substrate. The mechanical impulsions propagate and/or resonate differently if a failure occurs.

The ceramic substrate of the power semiconductor module has intrinsic electromechanical characteristics. One example is Aluminium Nitride (AlN) Direct Bonded Copper (DBC) ceramic substrate, which is commonly used in high-power devices for its excellent thermal properties and which has piezoelectric properties. During the operation of the power semiconductor module, the electric potential across the ceramic substrate changes with high dV/dt (in the order of 1 to 100V/ns). This high voltage transient causes a mechanical deformation/excitation in the ceramic substrate that propagates within the entire power semiconductor module according to the mechanical properties of its structure.

For example, when a power semiconductor module contains cracks, voids or delaminations, its mechanical properties are changed and the mechanical deformation/excitation propagates differently, for example, the frequency content and/or the damping of the mechanical deformation change. This mechanical deformation is called here "ceramic substrate electromechanical response" because it is caused by the electromechanical properties of the ceramic substrate.

According to a first mode of realization of the present invention, the damage assessment device 20 monitors the common mode current that flows across the ceramic substrate and the ceramic substrate is used as electromechanical sensor. The common mode current may be measured directly of indirectly as it will be disclosed hereinafter.

According to a second mode of realization of the present invention, the damage assessment device 20 uses a copper pad attached on the ceramic substrate. For example the copper pad is positioned on the top surface of the ceramic substrate. For example, the voltage between the copper pad and the bottom copper layer is measured. In a variant of realization of the second mode of realization, a high DC voltage is applied between the copper pad used as electrode and the bottom copper layer, and the current flowing through the copper pad is measured directly with a current sensor, like for example shunt resistors or other high-frequency response capability sensors.

According to a third mode of realization of the present invention, the damage assessment device 20 uses a specific electromechanical receptor that is integrated in the power semiconductor module. The electromechanical receptor is an electromechanical device that can be of different kind. For example, the electromechanical receptor is a sub-assembly composed of at least an electrostrictive material. A piezoelectric device such as a ceramic capacitor is one example of such a sub-assembly. For example, the electromechanical receptor is a sub-assembly composed of at least a magnetostrictive material. An inductor composed of a magnetizing coil and a magnetostrictive ferromagnetic material is one example of such sub-assembly.

According to a fourth mode of realization of the present invention, the damage assessment device 20 uses an optical source that generates a beam that is reflected by the surface of the ceramic substrate and received by an optical sensor. According to mechanical impulsions created within the ceramic substrate, the optical signal received by the optical sensor is modified.

For the four modes of implementation, the damage assessment device comprises at least an analog circuit and a processor, which will be described later.

Figure 2A:
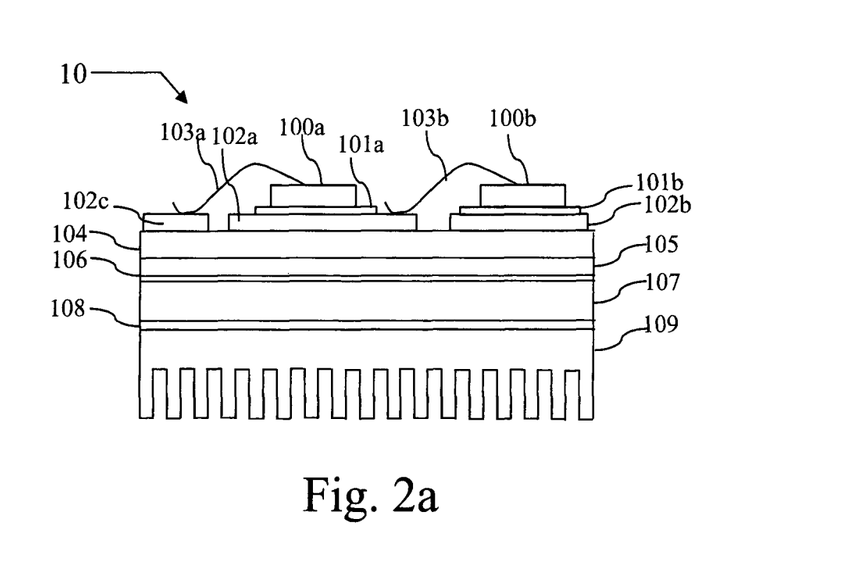
FIG. 2a represents an example of the architecture of a power semiconductor module according to a first mode of realization of the present invention.

FIG. 2a represents an example of the architecture of a power semiconductor module according to a first mode of realization of the present invention.

The power semiconductor module 10 comprises two dies noted 100a and 100b. The die 100a is connected to a copper layer 102a through a solder layer 101a and to another copper layer 102c through a wire bond 103a. The die 100b is connected to a copper layer 102b through a solder layer 101b and to the copper layer 102a through a wire bond 103b. The copper layers 102 are on a ceramic substrate 104.

A copper layer 105 is on the bottom of the ceramic substrate 104. The copper layers 102, 105 and the substrate 104 form a Direct Bonded Copper (DBC).

The DBC is soldered on a baseplate 107 which is fixed on a Heat sink 109 through a thermal interface 108.

According to the first mode of realization, the common mode current flowing though the ceramic substrate towards the grounded heat-sink 109 is measured directly. For example, the heat-sink 109 is connected to the ground potential through a current sensor. In a variant, common mode current is determined as the difference of the current going through two conductors which provides a positive electric power supply and a negative power supply to the power semiconductor module.

Figure 2B:
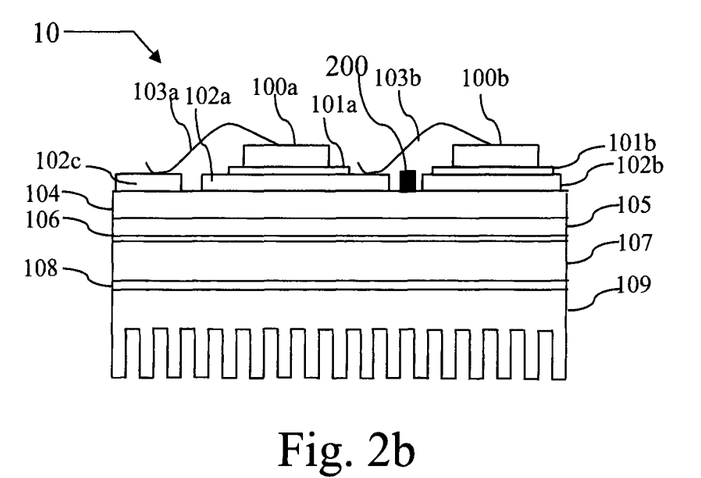
FIG. 2b represents an example of the architecture of a power semiconductor module according to a second mode of realization of the present invention.

FIG. 2b represents an example of the architecture of a power semiconductor module according to a second mode of realization of the present invention.

The power semiconductor module 10 comprises two dies noted 100a and 100b. The die 100a is connected to a copper layer 102a through a solder layer 101a and to another copper layer 102c through a wire bond 103a. The die 100b is connected to a copper layer 102b through a solder layer 101b and to the copper layer 102a through a wire bond 103b. The copper layers 102 are on a ceramic substrate 104.

A copper layer 105 is on the bottom of the ceramic substrate 104. The copper layers 102, 105 and the substrate 104 form a Direct Bonded Copper (DBC).

The DBC is soldered on a baseplate 107 which is fixed on a Heat sink 109 through a thermal interface 108.

According to the second mode of realization, a copper pad 200 is attached on the ceramic substrate 104. For example the copper pad 200 is positioned on the top surface of the ceramic substrate 104. For example, the voltage between the copper pad 200 and the copper layer 105 or the heat sink 109 is measured. In a variant of realization of the second mode of realization, a high DC voltage is applied between the copper pad 200 used as electrode and the copper layer 105 or the heat sink 109, and the current flowing through the copper pad 200 is measured directly with a current sensor, like for example shunt resistors or other high-frequency response capability sensors.

Figure 2C:
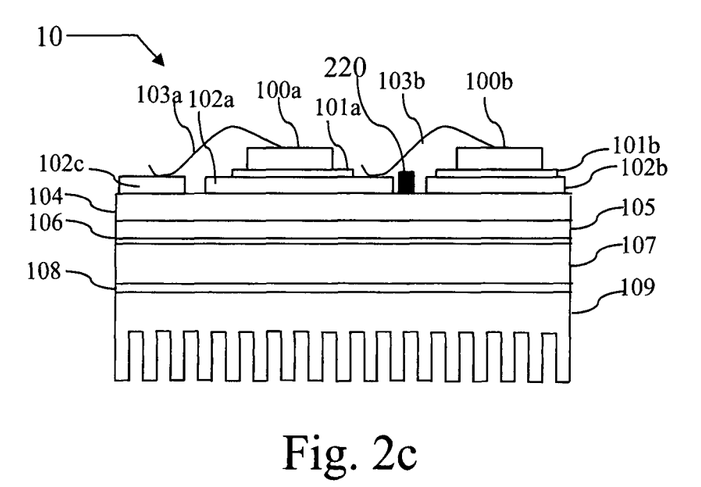
FIG. 2c represents an example of the architecture of a power semiconductor module according to a third mode of realization of the present invention.

FIG. 2c represents an example of the architecture of a power semiconductor module according to a third mode of realization of the present invention.

The power semiconductor module 10 comprises two dies noted 100a and 100b. The die 100a is connected to a copper layer 102a through a solder layer 101a and to another copper layer 102c through a wire bond 103a. The die 100b is connected to a copper layer 102b through a solder layer 101b and to the copper layer 102a through a wire bond 103b. The copper layers 102 are on a ceramic substrate 104

A copper layer 105 is on the bottom of the ceramic substrate 104. The copper layers 102, 105 and the substrate 104 form a Direct Bonded Copper (DBC).

The DBC is soldered on a baseplate 107 which is fixed on a Heat sink 109 through a thermal interface 108.

According to the third mode of realization, an electromechanical receptor 220 is attached on the ceramic substrate 104. The electromechanical receptor is a sub-assembly composed of at least an electrostrictive material like, for example, a ceramic capacitor or a magnetostrictive material like, for example, an inductor composed of a magnetizing coil and a magnetostrictive ferromagnetic material. The voltage or the current across such an electromechanical receptor is measured.

Figure 2D:
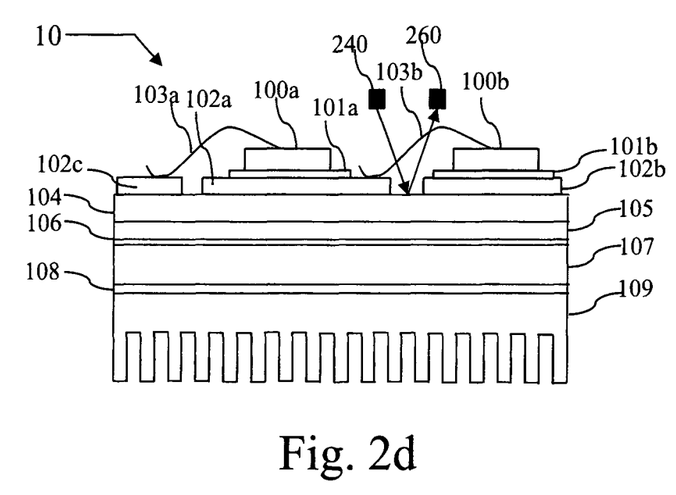
FIG. 2d represents an example of the architecture of a power semiconductor module according to a fourth mode of realization of the present invention.

FIG. 2d represents an example of the architecture of a power semiconductor module according to a fourth mode of realization of the present invention.

The power semiconductor module 10 comprises two dies noted 100a and 100b. The die 100a is connected to a copper layer 102a through a solder layer 101a and to another copper layer 102c through a wire bond 103a. The die 100b is connected to a copper layer 102b through a solder layer 101b and to the copper layer 102a through a wire bond 103b. The copper layers 102 are on a ceramic substrate 104

A copper layer 105 is on the bottom of the ceramic substrate 104. The copper layers 102, 105 and the substrate 104 form a Direct Bonded Copper (DBC).

The DBC is soldered on a baseplate 107 which is fixed on a Heat sink 109 through a thermal interface 108.

According to the fourth mode of realization, an optical source 240 generates a beam that is reflected by the surface of the ceramic substrate 104 and that is received by an optical sensor 260. According to mechanical impulsions created within the ceramic substrate 104, the optical signal received by the optical sensor 260 is modified.

Figure 3:
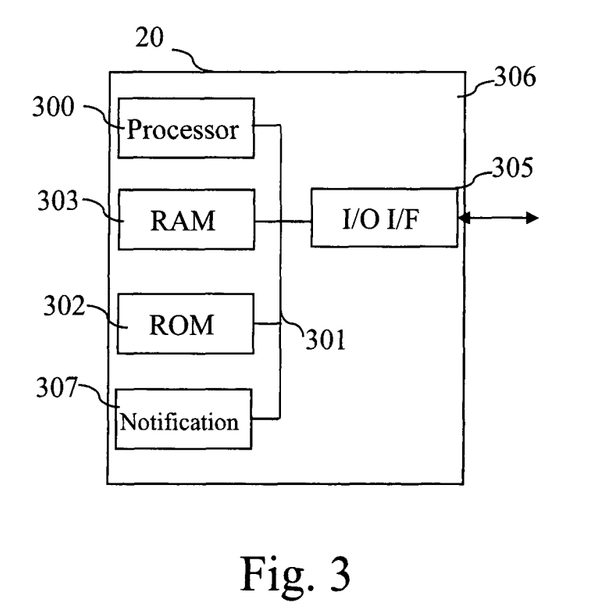
FIG. 3 represents an example of a device for estimating the level of damage of a power semiconductor module according to the present invention.

FIG. 3 represents an example of a device for estimating the level of damage of a power semiconductor module according to the present invention.

Figure 4:
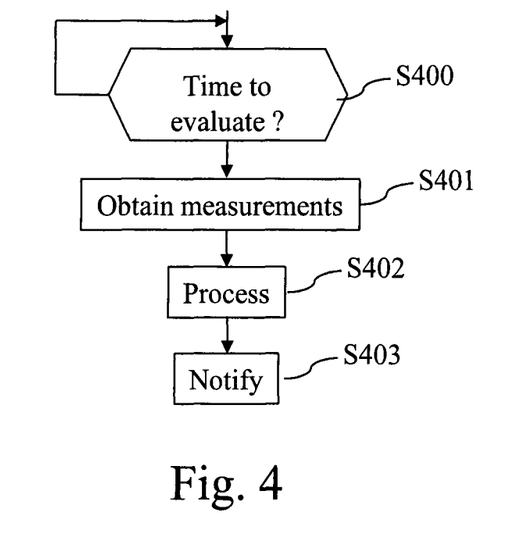
FIG. 4 represents an example of an algorithm for determining the damage assessment level of a power semiconductor module according to the present invention.

The damage assessment device 20 has, for example, an architecture based on components connected together by a bus 301 and a processor 300 controlled by a program as disclosed in FIG. 4.

The bus 301 links the processor 300 to a read only memory ROM 302, a random access memory RAM 303, an input output I/O IF interface 305 and a notification mean 307.

The memory 303 contains registers intended to receive variables and the instructions of the program related to the algorithm as disclosed in FIG. 4.

The processor 300 receives through the input output I/O IF 305, for example sensed temperatures, or voltage or currents sensed and which are representative of the the ceramic substrate electromechanical response of the power semiconductor module 10. The input output I/O IF 305 comprises analogue components.

The processor 300 may command the notification mean 307 in order to notify the level of damage of the power semiconductor module 10 or may command the notification mean 307 in order to notify a lifetime expectation of the power semiconductor module 10.

The read-only memory, or possibly a Flash memory 302 contains instructions of the program related to the algorithm as disclosed in FIG. 4, when the damage assessment device 20 is powered on, to the random access memory 303.

The damage assessment device 20 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the damage assessment device 20 includes circuitry, or a device including circuitry, causing the damage assessment device 20 to perform the program related to the algorithm as disclosed in FIG. 4.

FIG. 4 represents an example of an algorithm for determining the damage assessment level of a power semiconductor module according to the present invention.

The present algorithm is disclosed in an example wherein it is executed by the processor 300.

At step S400, the processor 300 checks if it is time to evaluate a damage assessment level of the power semiconductor module 10.

As the ceramic substrate electromechanical response is generated during switching operation of the power semiconductor module as it is caused by the voltage transients across the ceramic substrate, the ceramic substrate electromechanical response is typically measured continuously and measurement data are stored and processed at periodic intervals to perform a health assessment. Thus, a limited amount of data is used and storing and processing effort is reduced.

Generally, the instant of a ceramic substrate electromechanical response damage assessment is decided based on information relative to parameters such as the time elapsed since the last damage assessment evaluation, and/or the number of stress cycles defined as temperature variations or vibrations since the last damage assessment evaluation, the temperature of the power semiconductor module, the level of load current provided by the power semiconductor module, the level of voltage provided by the power semiconductor moduleor simply at each power-up. Thus, the damage assessment evaluation is performed when a degradation is most likely to have occurred, and storing and processing effort is reduced.

For example, the damage assessment evaluation is preformed every day, when the temperature, inside the power semiconductor module is known and stable, for a given load current and voltage, in the absence of external vibrations.

For example, when the power semiconductor module is included in an offshore windmill, the damage assessment evaluation is performed every time the windmill is stopped, or if the number of stress cycles since last measure is greater that a pre-defined threshold value and the temperature is monitored to be compensated by a data processing.

If it is time to evaluate a damage assessment level of the power semiconductor module 20, the processor 300 moves to step S401. Otherwise, the processor 300 returns to step S400.

At step S401, the processor 300 commands the input output I/O IF interface 305 in order to obtain measurements.

According to the first mode of realization, the processor 300 obtains the direct measure of the common-mode current towards the grounded heat sink 109 or processor 300 obtains the measured current going through two conductors which provide a positive electric power and a negative power supply to the power semiconductor module and determines the difference of the measured currents.

According to the second mode of realization, the processor 300 obtains the measured voltage between the copper pad 200 and the copper layer 105 or the heat sink 109 or the processor 300 commands the generating of a high DC voltage to be applied between the copper pad 200 used as electrode and the copper layer 105 or the heat sink 109 and obtains the measured current flowing through the copper pad 200.

According to the third mode of realization, the processor 300 obtains the signal response of the electromechanical receptor 220.

According to the fourth mode of realization, the processor 300 commands the optical source 240 that generates a beam that is reflected by the surface of the ceramic substrate 104 and obtains an electric signal from the optical sensor 260 that is representative of the received beam.

At next step S402, the processor 300 processes the measurements obtained at step S401.

The data processing consists in comparing the acquired ceramic substrate electromechanical response of the aging power semiconductor module with an initial ceramic substrate electromechanical response measure of the power semiconductor module in its healthy state. The healthy ceramic substrate electromechanical response measure can be generated during the first substrate electromechanical response acquisition or can be re-generated each time a maintenance inspection/action is performed on the power semiconductor module. The data processing involves the first step of data transformation and/or selection. For example, the signal is transposed in the frequency domain by a Fast Fourrier Transform. Thus, a specific frequency range corresponding to the possible self-resonant modes of the power module can be selected. The data processing involves the second step of data comparison. For example, the dominant frequencies within the specific frequency range are identified, and a distance is defined that compares these dominant frequencies to the initial dominant frequencies. The distance is typically a root mean square function. In another example, the amplitude of the spectrum at a specific frequency is identified, and a distance is defined that compares this amplitude to the initial amplitude of the spectrum at this same frequency.

Generally, the processor 300 uses a distance metric to compare the acquired ceramic substrate electromechanical response of the aging power semiconductor module with the initial ceramic substrate electromechanical response measure. One example is a quadratic distance such as the root mean square deviation.

The data processing involves the third step of damage assessment.

In a first embodiment, the processor 300 compares the distance metric to a threshold value. If the distance is higher than the threshold, a damage is detected, and a warning can be generated in the next step of notification, for example if a frequency corresponding to a specific resonant mode of the semiconductor power module has shifted by at least 5%, a damage is identified.

In another embodiment, the distance between the acquired ceramic substrate electromechanical response of the aging power semiconductor module with the initial ceramic substrate electromechanical response is processed by an algorithm that can take different forms. For example, the processor 400 performs an extrapolation of the distance with time in order to define the time of the crossing point between the distance and a threshold value.

In this case, the history of the determined distances stored in memory is used. For example, a selection of the determined distances is used. The evolution of the selection of the determined distances can be fitted to a model of the typical evolution of the distance.

The extrapolation is based on a model for determining the damage assessment of a power semiconductor module. The model can be physical or empirical, i.e. from data provided by other systems.

The model can be established beforehand using power cycling experiments on reference power semiconductor modules. The model can be updated during the operation of the product.

For example, the processor 300 compares the distances with threshold values, and if at least one of the distance is upper to a threshold, the processor 300 moves to step S403 in order to generate either a warning or remaining life estimation.

At step S403, the processor 300 commands the notification mean 307 in order to notify the level of damage of the power semiconductor module 10 or may command the notification mean 307 in order to notify a lifetime expectation of the power semiconductor module 10.

The notification can take the form of an electric signal that can be transmitted to the user or to the main controller of the product. This electric signal provides information on the apparition of a failure, or on the remaining time before failure.

Figure 5:
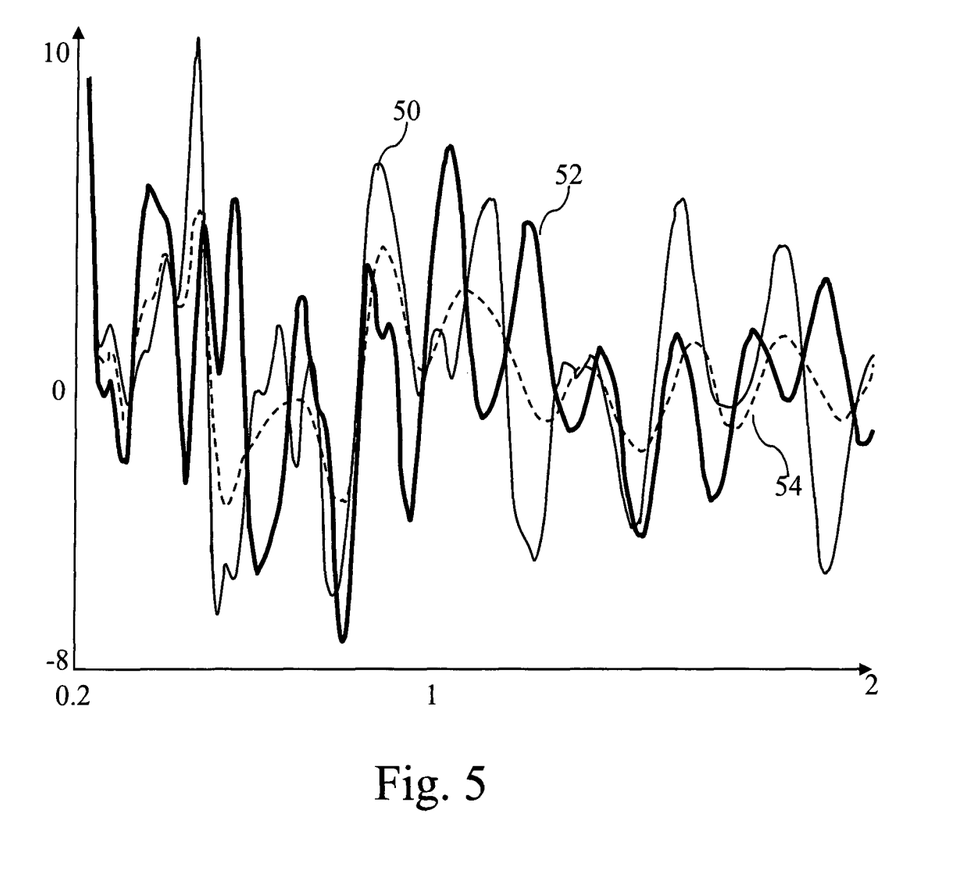
FIG. 5 represents an example of common mode currents that flows across the ceramic substrate for different levels of damage of the ceramic substrate.

FIG. 5 represents an example of common mode currents that flows across the ceramic substrate for different levels of damage of the ceramic substrate.

The horizontal axis represents the time in micro seconds and the vertical axis represents the current in mA.

The curves 50, 52 and 54 represent the common mode current variations after a voltage transient of 1KV in 100 ns.

As shown by FIG. 5, after the voltage transient, oscillations in the range of several mA and 1 to 10 Mhz occur.

The curve noted 50 represents the common mode current that flows across the ceramic substrate when there is a crack of 4 mm appearing on the solder layer 101a that links the power die to the copper layer 102a.

The curve noted 52 represents the common mode current that flows across the ceramic substrate when there is no crack on the solder layer 101a that links the power die to the copper layer 102a.

The curve noted 54 represents the common mode current that flows across the ceramic substrate when there is a crack of 2 mm appearing on the solder layer 101a that links the power die to the copper layer 102a.

As shown in FIG. 5, it is then possible to estimate a level of damage or a lifetime expectation of a power semiconductor module comprising at least one die that is mechanically, thermally, and electrically attached to a ceramic substrate.

Naturally, many modifications can be made to the embodiments of the invention described above without departing from the scope of the present invention.

The invention claimed is:

1. A method for estimating a level of damage or a lifetime expectation of a power semiconductor module, the method comprising:
controlling at least one power die of the power semiconductor module to generate changes in electrical potential across a ceramic substrate of the power semiconductor module, wherein the at least one power die is mechanically and electrically attached to the ceramic substrate, the ceramic substrate having piezoelectric properties, which cause mechanical impulsions within the ceramic substrate to propagate and/or resonate differently if a failure occurs, and the ceramic substrate having layers of copper on a top surface and a bottom surface of the ceramic substrate forming a direct bonded copper;
obtaining information representative of a mechanical deformation of the ceramic substrate in response to the changes in the electrical potential across the ceramic substrate,
determining if a notification indicating the level of damage or the lifetime expectation has to be performed according to the obtained information and reference information,
notifying the level of damage or the lifetime expectation if the determining step determines that the notification has to be performed.

2. The method according to claim 1, wherein information representative of the mechanical deformation of the ceramic substrate is a common mode current that flows across the ceramic substrate.

3. The method according to claim 2, wherein the common mode current is measured directly.

4. The method according to claim 2, wherein the common mode current is measured indirectly.

5. The method according to claim 1, wherein information representative of the mechanical deformation of the ceramic substrate is obtained using a copper pad attached on the top surface of the ceramic substrate, the information representative of the mechanical deformation includes a voltage between the copper pad and the copper layer on the bottom surface of the ceramic substrate.

6. The method according to claim 5, wherein information representative of the mechanical deformation of the ceramic substrate is a voltage between the copper pad and a copper layer at the bottom of the ceramic substrate.

7. The method according to claim 5, wherein a DC voltage is applied between the copper pad used as electrode and a copper layer at the bottom of the ceramic substrate and information representative of the mechanical deformation of the ceramic substrate is a current flowing through the copper pad.

8. The method according to claim 1, wherein information representative of the mechanical deformation of the ceramic substrate is obtained using an electromechanical receptor that is integrated in the power semiconductor module, the information representative of the mechanical deformation includes a voltage or current across the electromechanical receptor.

9. The method according to claim 1, wherein information representative of the mechanical deformation of the ceramic substrate is obtained using an optical source that generates a beam that is reflected by the surface of the ceramic substrate and received by an optical sensor, an optical signal received by the optical sensor being modified according to mechanical impulsions created within the ceramic substrate.

10. The method according to claim 1, wherein the determining if a notification indicating the level of damage or the lifetime expectation has to be performed is executed by transposing in a frequency domain the information representative of the mechanical deformation by a Fast Fourrier Transform.

11. The method according to claim 10, wherein the determining if a notification indicating the level of damage or the lifetime expectation has to be performed is executed by determining a distance between dominant frequencies and an initial set of dominant frequencies.

12. The method according to claim 10, wherein the distance is based on an amplitude at a predetermined frequency and on an initial amplitude at the predetermined frequency.

13. A device for estimating a level of damage or a lifetime expectation of a power semiconductor module comprising at least one power die that is mechanically and electrically attached to a ceramic substrate, wherein, the ceramic substrate has piezoelectric properties, which causes mechanical impulsions within the ceramic substrate to propagate and/or resonate differently if a failure occurs and the ceramic substrate has layers of copper on a top surface and a bottom surface of the ceramic substrate forming a direct bonded copper, the device comprises:
 a processor,
 wherein the processor is configured to:
 control the at least one power die to generate changes in electrical potential across the ceramic substrate,
 obtain information representative of a mechanical deformation of the ceramic substrate in response to the changes in the electrical potential across the ceramic substrate,
 determine if a notification indicating the level of damage or the lifetime expectation has to be performed according to the obtained information and reference information,
 notify the level of damage or the lifetime expectation if the determining step determines that the notification has to be performed.

* * * * *